(12) United States Patent
Song

(10) Patent No.: US 9,891,488 B2
(45) Date of Patent: Feb. 13, 2018

(54) ARRAY SUBSTRATE AND MANUFACTURE METHOD THEREOF

(71) Applicant: Shenzhen China Star Optoelectronics Technology Co., Ltd., Shenzhen, Guangdong (CN)

(72) Inventor: Liwang Song, Guangdong (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 0 days.

(21) Appl. No.: 15/714,852

(22) Filed: Sep. 25, 2017

(65) Prior Publication Data

US 2018/0011380 A1     Jan. 11, 2018

Related U.S. Application Data

(62) Division of application No. 14/424,007, filed on Feb. 25, 2015, now Pat. No. 9,804,459.

(51) Int. Cl.

| | |
|---|---|
| *G02F 1/1362* | (2006.01) |
| *H01L 27/12* | (2006.01) |
| *H01L 29/24* | (2006.01) |
| *H01L 29/786* | (2006.01) |
| *G02F 1/1333* | (2006.01) |

(Continued)

(52) U.S. Cl.
CPC ...... *G02F 1/136209* (2013.01); *G02F 1/1333* (2013.01); *G02F 1/1335* (2013.01); *G02F 1/1368* (2013.01); *G02F 1/13439* (2013.01); *G02F 1/133345* (2013.01); *G02F 1/134309* (2013.01); *H01L 27/127* (2013.01); *H01L 27/1218* (2013.01); *H01L 27/1222* (2013.01); *H01L 27/1225* (2013.01); *H01L 27/1248* (2013.01); *H01L 29/24* (2013.01); *H01L 29/4908* (2013.01); *H01L 29/78618* (2013.01); *H01L 29/78666* (2013.01); *H01L 29/78696* (2013.01); *G02F 2001/13685* (2013.01); *G02F 2001/133302* (2013.01);

(Continued)

(58) Field of Classification Search
CPC combination set(s) only.
See application file for complete search history.

(56) References Cited

U.S. PATENT DOCUMENTS

| | | | |
|---|---|---|---|
| 2010/0003774 A1* | 1/2010 | Liao | G02F 1/136209 438/29 |
| 2014/0008649 A1* | 1/2014 | Umeda | H01L 29/7869 257/43 |
| 2015/0221681 A1* | 8/2015 | Guo | G02F 1/136209 257/347 |

* cited by examiner

*Primary Examiner* — Kyoung Lee
*Assistant Examiner* — Ratisha Mehta
(74) *Attorney, Agent, or Firm* — Andrew C. Cheng

(57) ABSTRACT

A method for manufacturing an array substrate is provided. The array substrate, by providing a black matrix and a color resist layer on the array substrate and providing the color resist layer on the TFT layer, prevents bad influences on the color resist layer caused by a high temperature TFT process so as to provide a liquid crystal panel with improved displaying quality. The method includes, firstly, forming a black matrix on a substrate, and secondly, implementing a TFT manufacture process on the black matrix, and then forming a color resist layer after the TFT manufacture process. Accordingly, forming both the black matrix and the color resist layer on the array substrate can be achieved, where the color resist layer is formed after the TFT manufacture process to prevent bad phenomenon caused by the high temperature of the TFT process.

5 Claims, 3 Drawing Sheets

(51) Int. Cl.
*G02F 1/1335* (2006.01)
*G02F 1/1343* (2006.01)
*G02F 1/1368* (2006.01)
*H01L 29/49* (2006.01)

(52) U.S. Cl.
CPC ............ *G02F 2001/136222* (2013.01); *G02F 2201/123* (2013.01); *G02F 2202/103* (2013.01); *H01L 29/7869* (2013.01)

ARRAY SUBSTRATE AND MANUFACTURE METHOD THEREOF

CROSS REFERENCE TO RELATED APPLICATIONS

This is a divisional application of co-pending patent application Ser. No. 14/424,007, filed on Feb. 25, 2015, which is a national stage of PCT Application Number PCT/CN2015/072469, filed on Feb. 8, 2015, claiming foreign priority of Chinese Patent Application Number 201410717233.3, filed on Dec. 1, 2014.

FIELD OF THE INVENTION

The present invention relates to a display technology field, and more particularly to an array substrate and a manufacture method thereof.

BACKGROUND OF THE INVENTION

The LCD (Liquid Crystal Display) possesses many advantages of being ultra thin, power saved and radiation free. It has been widely utilized in, such as LCD TVs, mobile phones, PDAs, digital cameras, laptop screens or notebook screens. Most of LCDs on the market are backlight type LCDs, comprising a Backlight module and a liquid crystal panel combined with the Backlight module.

In the TFT-LCD (Thin Film Transistor Liquid Crystal Display), a BM (Black Matrix) is manufactured on the substrate in general, which is employed for diving the adjacent color resists for shielding the gaps among the color resists to prevent the light leakage or color mixture, and the technology of manufacturing the black matrix on the TFT array substrate is named BOA (BM On Array, the black matrix is attached on the array substrate), and BOA can solve the issue that the light resist areas are mismatched due to the mis-alignment of the upper, lower substrates.

Meanwhile, COA (Color Filter On Array, the color resist layer is attached on the array substrate) is proposed for promoting the display quality of the TFT-LCD (Thin Film Transistor Liquid Crystal Display).

As shown in FIG. 1, as the BOA and COA technologies are applied to the array substrate 100, the black matrix 200 and the color resist layer 300 are formed at the same layer for utilizing the spray coating technology. The color resist layer 300 will suffer the high temperature PVD (Physical vapor deposition) and CVD (Chemical vapor deposition) processes in the TFT manufacture process, which can seriously influence the performance of the color resist layer 300, and besides, the high temperature process will make the volatilization of the color resist layer 300 to generate gas and the gas becomes the source of the bubbles. The production yield is descended.

SUMMARY OF THE INVENTION

An objective of the present invention is to provide an array substrate, by locating both a black matrix and a color resist layer on the array substrate, and locating the color resist layer on the TFT layer to prevent the bad influence to the color resist layer from the high temperature TFT process, and accordingly to make the liquid crystal panel with higher display quality.

Another objective of the present invention is to provide a manufacture method of an array substrate, first to form a black matrix on the substrate, and second to implement TFT manufacture process on the black matrix, and then to form a color resist layer after the TFT manufacture. Accordingly, both the black matrix and the color resist layer manufactured on the array substrate can be achieved, and with forming the color resist layer after the TFT manufacture to prevent the bad phenomenon due to bubbles generated by the color resist volatilization from the high temperature TFT process, and accordingly to effectively make the liquid crystal panel with higher display quality and raise production yield.

For realizing the aforesaid objective, the present invention provides an array substrate, comprising a substrate, a black matrix located on the substrate, a TFT layer located on the black matrix, a color resist layer located on the TFT layer, a second passivation layer and a pixel electrode layer.

The TFT layer comprises a source/a drain located on the black matrix, a semiconductor layer located on the source/the drain, a gate isolation layer located on the semiconductor layer, a gate located on the gate isolation layer and a first passivation layer located on the gate.

The color resist layer is located on the first passivation layer, the second passivation layer is located on the color resist layer, and the pixel electrode layer is located on the second passivation layer, and the array substrate further comprises a via hole penetrating the second passivation layer, the color resist layer, the first passivation layer, the gate isolation layer and the semiconductor layer, and the pixel electrode layer is electrically connected with the source/the drain by the via hole.

The pixel electrode layer comprises a first ITO electrode layer and a second ITO electrode layer, and the first ITO electrode layer is located on the first passivation layer, and the array substrate further comprises a via hole penetrating the first passivation layer, the gate isolation layer and the semiconductor layer, and the first ITO electrode layer is electrically connected with the source/the drain by the via hole, and the color resist layer is located on the first ITO electrode layer, and the second passivation layer is located on the color resist layer, and the second ITO electrode layer is located on the second passivation layer, and the first ITO electrode layer and the second ITO electrode layer are connected to together form the pixel electrode layer.

A material of the source/the drain and the gate is copper or aluminum.

The semiconductor layer is a double layer structure comprising an amorphous silicon layer and a heavy doped N type silicon layer, or a single layer structure, comprising an indium gallium zinc oxide layer.

The present invention further provides a manufacture method of an array substrate, comprising steps of:

Step 1, providing a substrate and forming a black matrix on the substrate;

Step 2, forming a TFT layer on the black matrix; and

Step 3, forming a color resist layer, a second passivation layer, and a pixel electrode layer on the TFT layer and the substrate;

wherein Step 2 comprises:

Step 21, depositing and patterning a first metal layer on the black matrix to form a source/a drain;

Step 22, forming a semiconductor layer on the source/the drain, and forming a gate isolation layer on the semiconductor layer;

Step 23, depositing and patterning a second metal layer on the gate isolation layer to form a gate; and Step 24, forming a first passivation layer on the gate.

Step 3 may comprise:

Step 31, forming a color resist layer on the first passivation layer, and forming a second passivation layer on the color resist layer;

Step 32, forming a via hole in the second passivation layer, the color resist layer, the first passivation layer, the gate isolation layer and the semiconductor layer; and Step 33, forming a pixel electrode layer on the second passivation layer, wherein the pixel electrode layer is electrically connected with the source/the drain by the via hole.

Step 3 may comprise:

Step 31, forming a via hole in the first passivation layer, the gate isolation layer and the semiconductor layer;

Step 32, forming a first ITO electrode layer, wherein the first ITO electrode layer is electrically connected with the source/the drain by the via hole;

Step 33, forming a color resist layer on the first ITO electrode layer, and forming a second passivation layer on the color resist layer; and Step 34, forming a second ITO electrode layer on the second passivation layer, wherein the first ITO electrode layer and the second ITO electrode layer are connected to together form the pixel electrode layer.

A material of the source/the drain and the gate is copper or aluminum.

The semiconductor layer is a double layer structure comprising an amorphous silicon layer and a heavy doped N type silicon layer, or a single layer structure, comprising an indium gallium zinc oxide layer.

The present invention further provides an array substrate, comprising a substrate, a black matrix located on the substrate, a TFT layer located on the black matrix, a color resist layer located on the TFT layer, a second passivation layer and a pixel electrode layer;

wherein TFT layer comprises a source/a drain located on the black matrix, a semiconductor layer located on the source/the drain, a gate isolation layer located on the semiconductor layer, a gate located on the gate isolation layer and a first passivation layer located on the gate;

wherein the color resist layer is located on the first passivation layer, the second passivation layer is located on the color resist layer, and the pixel electrode layer is located on the second passivation layer, and the array substrate further comprises a via hole penetrating the second passivation layer, the color resist layer, the first passivation layer, the gate isolation layer and the semiconductor layer, and the pixel electrode layer is electrically connected with the source/the drain by the via hole;

wherein a material of the source/the drain and the gate is copper or aluminum.

The benefits of the present invention are: the present invention provides an array substrate, and applies BOA and COA technology on the array substrate at the same time, i.e. locating both the black matrix and the color resist layer on the array substrate. The color resist layer is located on the TFT layer and the black matrix to prevent the color resist from the high temperature TFT process and eliminate the source of the bubble source in the liquid crystal display panel. Meanwhile, the TFT layer utilizes the top gate TFT structure to prevent the leakage of the BOA structure array substrate, and accordingly, the display quality of the liquid crystal panel is effectively promoted. The present invention provides a manufacture method of an array substrate, and applies BOA and COA technology on the array substrate at the same time. First forms a black matrix on the substrate, and second implements TFT manufacture process on the black matrix, and then forms a color resist layer after the TFT manufacture. Accordingly, both the black matrix and the color resist layer manufactured on the array substrate can be achieved, and with forming the color resist layer after the TFT manufacture to prevent the bad phenomenon due to bubbles generated by the color resist volatilization from the high temperature TFT process, and meanwhile, the TFT layer utilizes the top gate TFT structure to prevent the leakage of the BOA structure array substrate, and accordingly, the display quality of the liquid crystal panel is effectively promoted and production yield is raised.

BRIEF DESCRIPTION OF THE DRAWINGS

The technical solution and the beneficial effects of the present invention are best understood from the following detailed description with reference to the accompanying figures and embodiments.

In drawings.

DETAILED DESCRIPTION OF PREFERRED EMBODIMENTS

For better explaining the technical solution and the effect of the present invention, the present invention will be further described in detail with the accompanying drawings and the specific embodiments.

Figure 1:
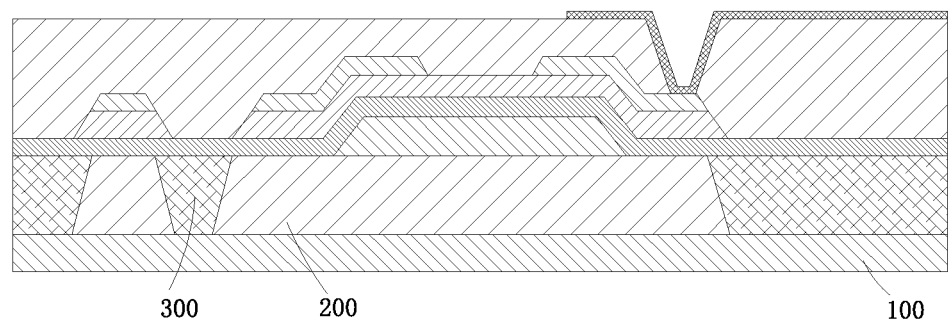
FIG. 1 is a sectional diagram of a TFT substrate structure according to prior art.
Figure 2:
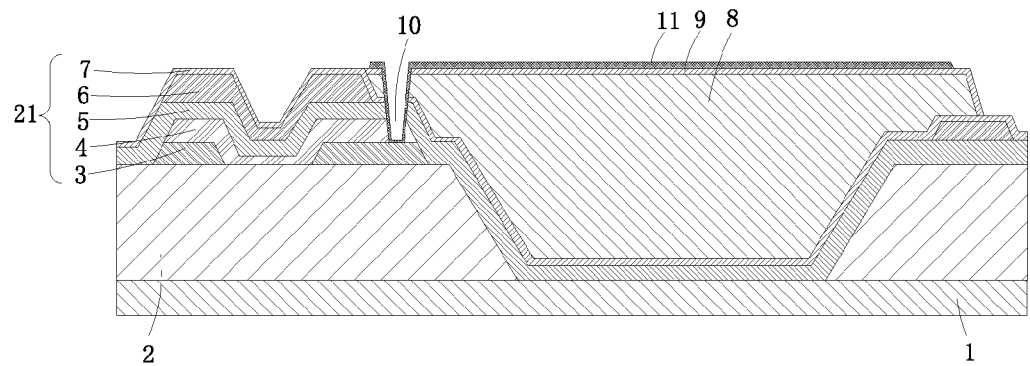
FIG. 2 is a sectional diagram of a TFT substrate structure according to the first embodiment of the present invention.

The present invention provides an array substrate, and applies BOA and COA technology on the array substrate at the same time, i.e. locating both the black matrix and the color resist layer on the array substrate. The color resist layer is located on the TFT layer and the black matrix to prevent the color resist from the high temperature TFT process and eliminate the source of the bubble source in the liquid crystal display panel. Referring to FIG. 2, a sectional diagram of a TFT substrate structure according to a first embodiment of the present invention is provided. In the first embodiment, the array substrate comprises a substrate 1, a black matrix 2 located on the substrate 1, a TFT layer 21 located on the black matrix 2, a color resist layer 8 located on the TFT layer 21, a second passivation layer 9 and a pixel electrode layer 11.

Preferably, the substrate 1 is a glass substrate.

Preferably, for preventing the leakage of the BOA type array substrate, the TFT layer 21 is selected to be a top gate type TFT structure, and the TFT layer 21 comprises a source/a drain 3 located on the black matrix 2, a semiconductor layer 4 located on the source/the drain 3, a gate isolation layer 5 located on the semiconductor layer 4, a gate 6 located on the gate isolation layer 5 and a first passivation layer 7 located on the gate 6.

The semiconductor layer 4 can be a double layer structure comprising an a-Si (amorphous silicon) layer and an n+ Si (heavy doped N type silicon) layer, or a single layer structure, comprising an IGZO (Indium Gallium Zinc Oxide) layer.

Preferably, a material of the source/the drain 3 and the gate 6 is copper or aluminum.

Preferably, a material of the gate isolation layer 5 is silicon nitride.

The color resist layer 8 is located on the first passivation layer 7; the second passivation layer 9 is located on the color resist layer 8; and the pixel electrode layer 11 is located on the second passivation layer 9; and the array substrate further comprises a via hole 10 penetrating the second passivation layer 9, the color resist layer 8, the first passivation layer 7, the gate isolation layer 5 and the semiconductor layer 4; and the pixel electrode layer 11 is electrically connected with the source/the drain 3 by the via hole 10.

Preferably, a material of the first passivation layer 7 and a material of the second passivation layer 9 are silicon nitride.

Preferably, a material of the pixel electrode layer 11 is indium tin oxide.

Figure 4:
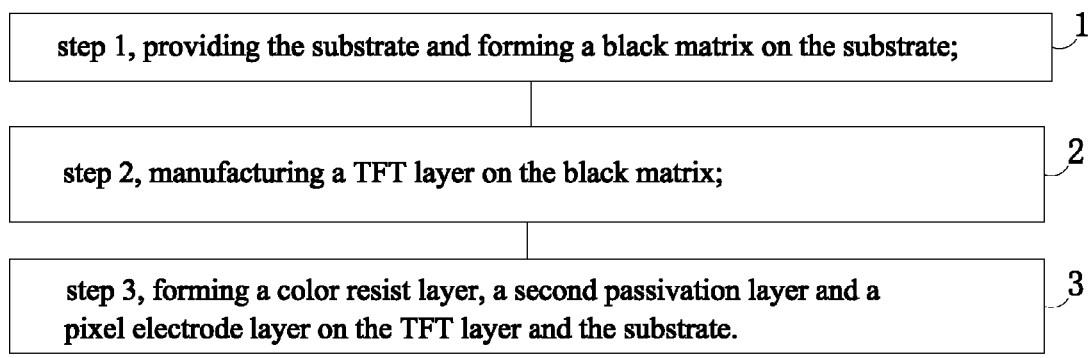
FIG. 4 is a flowchart of a manufacture method of a TFT substrate according to the present invention.

Referring to FIG. 4, a flowchart of a manufacture method of a TFT substrate according to the present invention is provided, and for obtaining the array substrate according to the first embodiment of the present invention, the present invention further provides a manufacture method of the array substrate, comprising the following steps:

Step 1, providing a substrate 1 and forming a black matrix 2 on the substrate.

Specifically, the substrate 1 in Step 1 is a glass substrate, and the black matrix 2 is formed on the substrate 1 through a coating process.

Step 2, forming a TFT layer 21 on the black matrix 2.

Preferably, for preventing the leakage of the BOA type array substrate, the TFT layer 21 is selected to be a top gate type TFT structure.

Specifically, Step 2 comprises the following steps:

Step 21, depositing and patterning a first metal layer on the black matrix 2 to form a source/a drain 3.

Preferably, a material of the source/the drain 3 is copper or aluminum.

Step 22, forming a semiconductor layer 4 on the source/the drain 3, and forming a gate isolation layer 5 on the semiconductor layer 4.

The semiconductor layer 4 can be a double layer structure comprising an a-Si (amorphous silicon) layer and an n+ Si (heavy doped N type silicon) layer, or a single layer structure, comprising an IGZO (Indium Gallium Zinc Oxide) layer.

Preferably, a material of the gate isolation layer 5 is silicon nitride.

Step 23, depositing and patterning a second metal layer on the gate isolation layer 5 to form a gate 6.

Preferably, a material of the gate 6 is copper or aluminum.

Step 24, forming a first passivation layer 7 on the gate 6.

Preferably, a material of the first passivation layer 7 is silicon nitride.

Step 3, forming a color resist layer 8, a second passivation layer 9 and a pixel electrode layer 11 on the TFT layer 21 and the substrate 1.

Specifically, Step 3 comprises the following steps:

Step 31, forming a color resist layer 8 on the first passivation layer 7, and forming a second passivation layer 9 on the color resist layer 8.

Specifically, the color resist layer 8 is formed through a coating process.

Preferably, a material of the first passivation layer 7 and a material of the second passivation layer 9 are silicon nitride.

Step 32, forming a via hole 10 in the second passivation layer 9, the color resist layer 8, the first passivation layer 7, the gate isolation layer 5 and the semiconductor layer 4.

Specifically, the via hole 10 is formed through a dry etching process.

Step 33, forming a pixel electrode layer 11 on the second passivation layer 9, wherein the pixel electrode layer 11 is electrically connected with the source/the drain 3 by the via hole 10.

Specifically, the pixel electrode layer 11 is formed through a vacuum coating process and a wet etching process.

Preferably, a material of the pixel electrode layer 11 is indium tin oxide.

Figure 3:
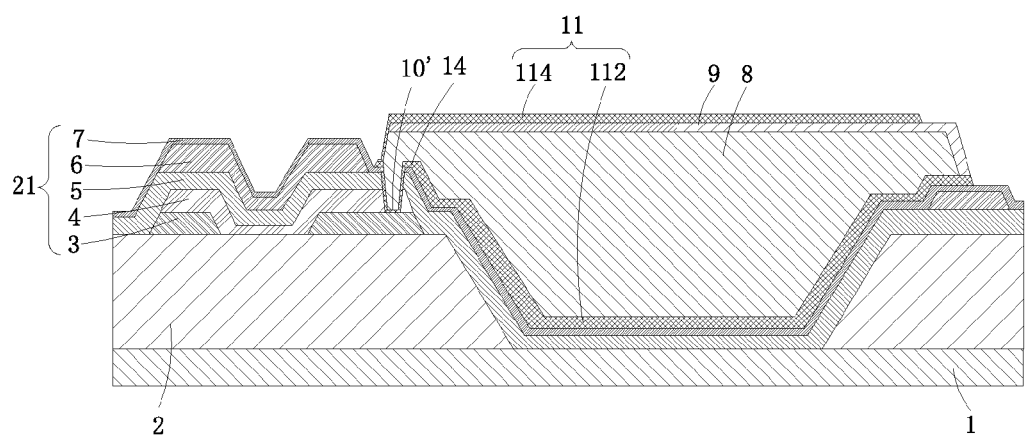
FIG. 3 is a sectional diagram of a TFT substrate structure according to the second embodiment of the present invention.

Referring to FIG. 3, a sectional diagram of a TFT substrate structure according to a second embodiment of the present invention is provided. In the second embodiment, the array substrate comprises a substrate 1, a black matrix 2 located on the substrate 1, a TFT layer 21 located on the black matrix 2, a color resist layer 8 located on the TFT layer 21, a second passivation layer 9 and a pixel electrode layer 11.

Preferably, the substrate 1 is a glass substrate.

The TFT layer 21 is a top gate type TFT, and the TFT layer 21 comprises a source/a drain 3 located on the black matrix 2, a semiconductor layer 4 located on the source/the drain 3, a gate isolation layer 5 located on the semiconductor layer 4, a gate 6 located on the gate isolation layer 5 and a first passivation layer 7 located on the gate 6.

The semiconductor layer 4 can be a double layer structure comprising an a-Si (amorphous silicon) layer and an n+ Si (heavy doped N type silicon) layer, or a single layer structure, comprising an IGZO (Indium Gallium Zinc Oxide) layer.

Preferably, a material of the source/the drain 3 and the gate 6 is copper or aluminum.

Preferably, a material of the gate isolation layer 5 is silicon nitride.

The pixel electrode layer 11 comprises a first ITO electrode layer 112 and a second ITO electrode layer 114, and the first ITO electrode layer 112 is located on the first passivation layer 7, and the array substrate further comprises a via hole 10' penetrating the first passivation layer 7, the gate isolation layer 5 and the semiconductor layer 4, and the first ITO electrode layer 112 is electrically connected with the source/the drain 3 by the via hole 10', and the color resist layer 8 is located on the first ITO electrode layer 112, and the second passivation layer 9 is located on the color resist layer 8, and the second ITO electrode layer 114 is located on the second passivation layer 9, and the first ITO electrode layer 112 and the second ITO electrode layer 114 are connected to together form the pixel electrode layer 11.

Preferably, a material of the first passivation layer 7 and a material of the second passivation layer 9 are silicon nitride.

Preferably, a material of the first ITO electrode layer 112 and a material of the second ITO electrode layer 114 are indium tin oxide.

Compared with the array substrate according to the first embodiment of the present invention, the merit of the array substrate according to the second embodiment of the present invention is that the via hole is not formed in the color resist layer, and therefore, the flatness of the TFT substrate can be reserved better.

Referring to FIG. 4, a flowchart of a manufacture method of a TFT substrate according to the present invention is provided, and for obtaining the array substrate according to the second embodiment of the present invention, the present invention further provides a manufacture method of the array substrate, comprising the following steps:

Step 1, providing a substrate 1 and forming a black matrix 2 on the substrate 1.

Specifically, the substrate 1 in Step 1 is a glass substrate, and the black matrix 2 is formed on the substrate 1 through a coating process.

Step 2, forming a TFT layer 21 on the black matrix 2.

Specifically, Step 2 comprises the following steps:

Step 21, depositing and patterning a first metal layer on the black matrix 2 to form a source/a drain 3.

Preferably, a material of the source/the drain 3 is copper or aluminum

Step 22, forming a semiconductor layer 4 on the source/the drain 3, and forming a gate isolation layer 5 on the semiconductor layer 4.

The semiconductor layer 4 can be a double layer structure comprising an a-Si (amorphous silicon) layer and an n+ Si (heavy doped N type silicon) layer, or a single layer structure, comprising an IGZO (Indium Gallium Zinc Oxide) layer.

Preferably, a material of the gate isolation layer 5 is silicon nitride.

Step 23, depositing and patterning a second metal layer on the gate isolation layer 5 to form a gate 6.

Preferably, a material of the gate 6 is copper or aluminum.

Step 24, forming a first passivation layer 7 on the gate 6.

Preferably, a material of the first passivation layer 7 is silicon nitride.

Step 3, forming a color resist layer 8, a second passivation layer 9 and a pixel electrode layer 11 on the TFT layer 21 and the substrate 1.

Specifically, Step 3 comprises the following steps:

Step 31, forming a via hole 10 in the first passivation layer 7, the gate isolation layer 5 and the semiconductor layer 4.

Specifically, the via hole 10' is formed through a dry etching process.

Step 32, forming a first ITO electrode layer 112 on the first passivation layer 7, wherein the first ITO electrode layer 112 is electrically connected with the source/the drain 3 by the via hole 10'.

Specifically, the first ITO electrode layer 112 is formed through a vacuum coating process and a wet etching process.

Step 33, forming a color resist layer 8 on the first ITO electrode layer 112, and forming a second passivation layer 9 on the color resist layer 8.

Specifically, the color resist layer 8 is formed through a coating process.

Preferably, a material of the second passivation layer 9 is silicon nitride.

Step 34, forming a second ITO electrode layer 114 on the second passivation layer 9, wherein the first ITO electrode layer 112 and the second ITO electrode layer 114 are connected to together form the pixel electrode layer 11.

Specifically, the second ITO electrode layer 114 is formed through a vacuum coating process and a wet etching process.

Preferably, a material of the first ITO electrode layer 112 and a material of the second ITO electrode layer 114 are indium tin oxide.

Compared with the manufacture method of the array substrate according to the first embodiment of the present invention, the merit of the manufacture method of the array substrate according to the second embodiment of the present invention is that the via hole is not formed in the color resist layer, and therefore, the flatness of the TFT substrate can be reserved better.

In conclusion, the present invention provides an array substrate, and applies BOA and COA technology on the array substrate at the same time, i.e. locating both the black matrix and the color resist layer on the array substrate. The color resist layer is located on the TFT layer and the black matrix to prevent the color resist from the high temperature TFT process and eliminate the source of the bubble source in the liquid crystal display panel. Meanwhile, the TFT layer utilizes the top gate TFT structure to prevent the leakage of the BOA structure array substrate, and accordingly, the display quality of the liquid crystal panel is effectively promoted. The present invention provides a manufacture method of an array substrate, and applies BOA and COA technology on the array substrate at the same time. First forms a black matrix on the substrate, and second implements TFT manufacture process on the black matrix, and then forms a color resist layer after the TFT manufacture. Accordingly, both the black matrix and the color resist layer manufactured on the array substrate can be achieved, and with forming the color resist layer after the TFT manufacture to prevent the bad phenomenon due to bubbles generated by the color resist volatilization from the high temperature TFT process, and meanwhile, the TFT layer utilizes the top gate TFT structure to prevent the leakage of the BOA structure array substrate, and accordingly, the display quality of the liquid crystal panel is effectively promoted and production yield is raised.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A method for manufacturing an array substrate, comprising the following steps:
   step 1, providing a substrate and forming a black matrix on the substrate;
   step 2, forming a thin-film transistor (TFT) layer on the black matrix; and
   step 3, forming a color resist layer, a second passivation layer, and a pixel electrode layer on the TFT layer and the substrate, wherein the color resist layer is arranged above and separated from the black matrix;
   wherein Step 2 comprises the following steps:
   step 21, depositing and patterning a first metal layer on the black matrix to form a source/a drain;
   step 22, forming a semiconductor layer on the source/the drain, and forming a gate isolation layer on the semiconductor layer;
   step 23, depositing and patterning a second metal layer on the gate isolation layer to form a gate; and
   step 24, forming a first passivation layer on the gate.

2. The method as claimed claim 1, wherein step 3 comprises the following steps:
   step 31, forming a color resist layer on the first passivation layer, and forming a second passivation layer on the color resist layer;
   step 32, forming a via hole in the second passivation layer, the color resist layer, the first passivation layer, the gate isolation layer and the semiconductor layer; and
   step 33, forming a pixel electrode layer on the second passivation layer, wherein the pixel electrode layer is electrically connected with the source/the drain through the via hole.

3. The method as claimed in claim 1, wherein step 3 comprises the following steps:
   step 31, forming a via hole in the first passivation layer, the gate isolation layer and the semiconductor layer;

step 32, forming a first indium tin oxide (ITO) electrode layer, wherein the first ITO electrode layer is electrically connected with the source/the drain through the via hole;

step 33, forming a color resist layer on the first ITO electrode layer, and forming a second passivation layer on the color resist layer; and step 34, forming a second ITO electrode layer on the second passivation layer, wherein the first ITO electrode layer and the second ITO electrode layer are connected to together form the pixel electrode layer.

4. The method as claimed in claim 1, wherein a material of the source/the drain and the gate is copper or aluminum.

5. The method as claimed in claim 1, wherein the semiconductor layer is a double layer structure comprising an amorphous silicon layer and a heavy doped N type silicon layer, or a single layer structure comprising an indium gallium zinc oxide layer.

\* \* \* \* \*